(12) United States Patent
Majkic et al.

(10) Patent No.: US 11,923,105 B2
(45) Date of Patent: Mar. 5, 2024

(54) METHODS AND SYSTEMS FOR FABRICATING HIGH QUALITY SUPERCONDUCTING TAPES

(71) Applicant: The University of Houston System, Houston, TX (US)

(72) Inventors: Goran Majkic, Houston, TX (US); Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/887,844

(22) Filed: Aug. 15, 2022

(65) Prior Publication Data
US 2022/0392669 A1    Dec. 8, 2022

Related U.S. Application Data

(60) Continuation of application No. 16/930,529, filed on Jul. 16, 2020, now Pat. No. 11,417,444, which is a
(Continued)

(51) Int. Cl.
| | |
|---|---|
| *H01B 12/06* | (2006.01) |
| *C23C 16/02* | (2006.01) |
| *C23C 16/40* | (2006.01) |
| *C23C 16/448* | (2006.01) |
| *C23C 16/54* | (2006.01) |

(Continued)

(52) U.S. Cl.
CPC ......... *H01B 12/06* (2013.01); *C23C 16/0209* (2013.01); *C23C 16/408* (2013.01); *C23C 16/448* (2013.01); *C23C 16/545* (2013.01); *H01B 13/00* (2013.01); *H01B 13/0026* (2013.01); *H01B 13/008* (2013.01); *H10N 60/0464* (2023.02)

(58) Field of Classification Search
CPC ............................ H01B 12/06; C23C 16/0209
See application file for complete search history.

(56) References Cited

U.S. PATENT DOCUMENTS

| | | |
|---|---|---|
| 3,763,552 A | 9/1973 | Brown et al. |
| 8,268,386 B2 | 9/2012 | Selvamanickam et al. |
| | (Continued) | |

FOREIGN PATENT DOCUMENTS

| | | |
|---|---|---|
| JP | H08041647 | 2/1996 |

OTHER PUBLICATIONS

Goyal, A. et al., "High critical current density superconducting tapes by epitaxial deposition of YBa2Cu3O x thick films on biaxially textured metals," AIP Publishing, Applied Physics Letters 69, 1795 (1996), 4 pages.
(Continued)

*Primary Examiner* — Paul A Wartalowicz
(74) *Attorney, Agent, or Firm* — Blank Rome LLP

(57) ABSTRACT

An MOCVD system fabricates high quality superconductor tapes with variable thicknesses. The MOCVD system can include a gas flow chamber between two parallel channels in a housing. A substrate tape is heated and then passed through the MOCVD housing such that the gas flow is perpendicular to the tape's surface. Precursors are injected into the gas flow for deposition on the substrate tape. In this way, superconductor tapes can be fabricated with variable thicknesses, uniform precursor deposition, and high critical current densities.

15 Claims, 13 Drawing Sheets

Related U.S. Application Data continuation of application No. 16/727,326, filed on Dec. 26, 2019, now Pat. No. 11,410,797, which is a continuation of application No. 15/139,127, filed on Apr. 26, 2016, now abandoned, which is a division of application No. 14/208,818, filed on Mar. 13, 2014, now Pat. No. 9,892,827.

(60) Provisional application No. 61/801,478, filed on Mar. 15, 2013.

(51) Int. Cl.
  *H01B 13/00* (2006.01)
  *H01B 13/008* (2006.01)
  *H10N 60/01* (2023.01)

(56) References Cited

U.S. PATENT DOCUMENTS

| | | |
|---|---|---|
| 9,061,344 B1 | 6/2015 | Mckay |
| 2003/0010453 A1 | 1/2003 | Tanaka et al. |
| 2004/0016401 A1 | 1/2004 | Ignatiev et al. |
| 2004/0247779 A1 | 12/2004 | Selvamanickam et al. |
| 2006/0040830 A1 | 2/2006 | Thieme et al. |
| 2006/0067605 A1 | 3/2006 | Mirkarimi et al. |
| 2006/0115580 A1 | 6/2006 | Selvamanickam et al. |
| 2007/0224348 A1 | 9/2007 | Dickey et al. |
| 2007/0227623 A1 | 10/2007 | Fluekiger et al. |
| 2008/0310892 A1 | 12/2008 | Inada |
| 2009/0064931 A1 | 3/2009 | Horii et al. |
| 2010/0113280 A1 | 5/2010 | Wu et al. |
| 2010/0279875 A1 | 11/2010 | Baecker |
| 2011/0009273 A1 | 1/2011 | Lee et al. |
| 2011/0245083 A1 | 10/2011 | Sathyamurthy et al. |
| 2011/0259052 A1 | 10/2011 | Kuhn |
| 2012/0264612 A1 | 10/2012 | Goyal et al. |
| 2012/0318196 A1 | 12/2012 | Ignatiev et al. |

OTHER PUBLICATIONS

Ijima, Yasuhiro et al., "Biaxially Aligned YBa2Cu3O7-X Thin Film Tapes," Elsevier Science Publishers B.V., Physica C 185-189 (1991), 2 pages.

International Search Report and Written Opinion for corresponding Application No. PCT/US2014/025843, dated Jan. 22, 2015.

Lin, et al., "A review of thickness-induced evolutions of microstructure and superconducting performance of REBa2Cu3O7-δ coated conducted," Advances in Manufacturing, 5, May 10, 2017, DOI: 10.1007/s40436-017-0173-x.

Office Action received in corresponding Japanese Patent Application No. 2016-501981, dated Oct. 4, 2016.

Rupich, et al., "Advanced development of TFA-MOD coated conductors," Physica C 471 (2011), pp. 919-923, doi:10.1016/j.physc.2011.05.089.

Selvamanickam, Venkat et al., "High Performance 2G Wires: From R&D to Pilot Scale Manufacturing," IEEE Transactions on Applied Superconductivity, vol. 19, No. 3, 2009, 6 pages.

Wu, X. D. et al., "Properties of YBa2Cu3O7 thick firms on flexible buffered metallic substrates," AIP Publishing, Applied Physics Letters 67, 2397 (1995), 4 pages.

Zhou, et al., "Improved microstructure and enhanced low-field Jc in (Y0.67Eu0.33)Ba2Cu3O7-δ films," Supercond. Sci. Technol. 21 (2008) 025001 (5pp), doi:10.1088/0953-2048/21/02;025001.

METHODS AND SYSTEMS FOR FABRICATING HIGH QUALITY SUPERCONDUCTING TAPES

CROSS-REFERENCES TO RELATED APPLICATIONS

This application is a continuation of U.S. patent application Ser. No. 16/930,529, filed on Jul. 16, 2020, issued on Aug. 16, 2022 as U.S. Pat. No. 11,417,444, which is a continuation of U.S. patent application Ser. No. 16/727,326, filed on Dec. 26, 2019, issued on Aug. 9, 2022 as U.S. Pat. No. 11,410,797, which is a continuation of U.S. patent application Ser. No. 15/139,127, filed on Apr. 26, 2016, which is a divisional of U.S. patent application Ser. No. 14/208,818, filed on Mar. 13, 2014, issued on Feb. 13, 2018 as U.S. Pat. No. 9,892,827, which claims priority to U.S. Provisional Application No. 61/801,478, filed on Mar. 15, 2013, all of which are herein incorporated by reference in their entirety.

GOVERNMENT SPONSORSHIP

This invention was made with government support under DE-AR0000141 awarded by the Advanced Research Projects Agency-Energy (ARPA-E). The government has certain rights in the invention.

BACKGROUND

Several materials systems are being developed to solve the looming problems associated with energy generation, transmission, conversion, storage, and use. Superconductors are a unique system that provides a solution across a broad spectrum of energy problems. Superconductors enable high efficiencies in generators, power transmission cables, motors, transformers and energy storage. Further, superconductors transcend applications beyond energy to medicine, particle physics, communications, and transportation.

Superconducting tapes are becoming more and more popular. This is in part due to successful fabrication techniques that create epitaxial, single-crystal-like thin films on polycrystalline substrates (Y. Iijima, et al., "Biaxially Aligned $YBa_2Cu_3O_{7-x}$ Thin Film Tapes," Physica C 185, 1959 (1991); X. D. Wu, et al., "Properties of $YBa_2Cu_3O_7$ Thick Films on Flexible Buffered Metallic Substrates," Appl. Phys. Lett. 67, 2397 (1995); A. Goyal, et al., Appl. Phys. Lett. 69, 1795 (1996); V. Selvamanickam et al., "High Performance 2G wires: From R&D to Pilot-scale Manufacturing," IEEE Trans. Appl. Supercond. 19, 3225 (2009)). Superconducting films that are processed by this technique exhibit critical current densities comparable to that achieved in epitaxial films grown on single crystal substrates. Using this technique, several institutions have demonstrated pilot-scale manufacturing of superconducting composite tapes. One popular process used to manufacture superconducting tapes is called metal organic chemical vapor deposition (MOCVD) (V. Selvamanickam et al., "High Performance 2G wires: From R&D to Pilot-scale Manufacturing," IEEE Trans. Appl. Supercond. 19, 3225 (2009)).

Current MOCVD methods and systems used for manufacturing of superconductor tapes have significant drawbacks, which are primarily rooted in design flaws (V. Selvamanickam et al., "Method for Manufacturing High-Temperature Superconducting Conductors," U.S. Pat. No. 8,268,386). For example, FIG. 1 illustrates a schematic of the showerhead 100 used in current MOCVD systems used for manufacturing of superconductor tapes. The core of the MOCVD system is a reactor 110 which consists of a showerhead 115 to disperse the precursor flow 120 on a tape 125 and a heater 130 to heat the tape 125 by contact heating as it travels along the heater 130.

One major drawback of the current MOCVD design is that the heating and deposition mechanisms do not provide uniform heating or uniform deposition on the tape. These design flaws produce superconductor tapes with a poor surface microstructure, which can significantly deteriorate the tape's superconducting quality. For example, the superconductor tape is heated by a fairly bulky heater by means of contact heating, and so a constant heater temperature does not necessarily yield a constant tape temperature, especially in thicker films. In addition, since the tape travels quickly over the heater, there are sporadic losses of contact between the tape and heater. And because the tape has a very small mass, even brief losses of contact result in significant decreases in tape temperature. Furthermore, precursor flow is directed downwards towards the tape, and once it hits the tape it flows sideways across the tape. This non-uniform flow causes temperature differences across the tape, and thus deviations from the optimum temperature window. All of these temperature fluctuations can cause the process to deviate from the optimum temperature window and produce misoriented grain growth in the tape's surface microstructure. In addition, there are no solutions available in current systems to directly monitor tape temperature since there is no line of sight available from outside the reactor, and there is no room in the reactor to monitor the tape temperature directly without interfering with the precursor flow. Current MOCVD designs monitor temperature using a thermocouple inside the heating block. But because the tape temperature is not uniform deviations from the optimum temperature window typically go unnoticed.

Furthermore, the deposition flow from the showerhead reaches the tape only at the center, and most of the other flow is pumped out without fully reaching the substrate. This non-uniform precursor flow results in non-uniform superconductor growth, including misoriented grain growth. This deposition phenomenon is illustrated in FIG. 2, which is a finite element analysis of turbulent fluid flow and solid/fluid heat transfer in a current MOCVD system. The streamlines 200 show the flow path of the precursor, while the color differences show flow inhomogeneity. The finite element plot illustrates that a substantial fraction of the precursor (especially that injected away from the center of the showerhead) does not make it to the tape surface, which reduces the conversion efficiency of precursor to film. Also, the non-uniform flow rate will cause non-uniform film deposition rate, which in turn can cause inhomogeneities in the film.

The aforementioned heating and deposition drawbacks are exacerbated as the superconducting film is thickened during fabrication. Thus, as the film is thickened misoriented grain growth increases. For example, FIG. 3A shows the surface microstructure of a 1 μm thick superconductor tape 300 fabricated by current MOCVD methods. The microstructure is fairly homogenous with relatively little grain misorientation 310. However, as seen in FIG. 3B, a 2 μm thick superconductor tape 320 presents with a substantial amount of misoriented grains 330. FIG. 3C shows a cross section of the 2 μm tape 320 with a-axis grains 330. These illustrations prove that the misoriented grains predominantly form after the initial 1 μm of tape is fabricated.

As misoriented grain growth increases with tape thickness, critical current density (critical current/cross sectional area) decreases, i.e. the quality of the superconductor film degrades with increasing tape thickness. This phenomenon is illustrated in FIG. 4, which shows critical current density as a function of superconductor tape thickness in tape made by a current MOCVD system. One explanation for this trend is that increases in misoriented grain growth in thicker films impede the flow of current, thus resulting in lower current densities. And when the current density decreases, the quality of the superconducting tape degrades. This indicates that the present-day MOCVD process is not suitable to fabricate high-quality superconducting tapes thicker than approximately 1 µm.

Another drawback to current MOCVD design is that the process is inefficient and costly. For example, as explained above, the MOCVD's deposition design can result in non-uniform tapes where most of the flow is pumped out without fully reaching the substrate. In addition, the showerhead is positioned at a substantial distance from the tape and heating block in order to avoid premature precursor decomposition from the heating block. As a result, expensive precursors are wasted in the manufacturing process leading to lower throughput. In addition, the deposition process is relatively slow and results in low yields. For example, the current process uses 2,2,6,6-tetramethyl-3,5-heptanedionate (–thd) metal organic complexes of Y or other rare earth (RE), Ba, and Cu as a precursor. The –thd complexes are deposited on the substrate and dissociate at an appropriate temperature and oxygen partial pressure to form $YBa_2Cu_3O_x$ superconductor (or $REB_{a2}Cu_3O_x$ (REBCO, RE=rare earth)). In the present MOCVD system, precursor dissociation is entirely thermally activated by the high substrate temperature. But thermal activation alone does not result in complete dissociation of precursors, and so, precursor to film conversion efficiency is low—only about 15% of the theoretical value.

Furthermore, it would be desirable to activate precursors using plasma activation. However, it is not feasible to introduce plasma in prior art reactors because the metallic showerhead and susceptor don't allow for it (V. Selvamanickam et al., "Ultraviolet (UV) and plasma assisted metalorganic chemical vapor deposition (MOCVD) system," U.S. Pat. Pub. No. 2004/0247779).

Thus, there is need in the art for methods and systems that can fabricate superconducting tapes having films with varied thicknesses at constant temperature, with uniform precursor deposition, and in high yields and efficiencies (e.g., >15%). There is also need in the art for methods and systems that can fabricate superconducting tapes with films at higher thicknesses (e.g., up to 3 µm thick) with minimal misoriented a-axis grain growth and high critical current densities. Finally, there is need in the art for a system that can fabricate superconductor tapes via plasma activation.

SUMMARY

A metal organic chemical vapor deposition (MOCVD) system can be used to fabricate high quality superconductor tapes. In one arrangement, the MOCVD system described herein can include a gas flow path between two channels. A substrate tape can be heated and then delivered to the MOCVD system perpendicular to the gas flow path. The gas flow may include one or more precursors delivered parallel or perpendicular to the substrate tape's plane. The precursor can decompose thermally as it contacts the heated substrate tape to deposit the superconductor film. The result may be a high quality superconductor tape.

In one embodiment, the MOCVD system described herein can fabricate a superconductor tape at a constant temperature with uniform precursor deposition. In another embodiment, the MOCVD system described herein can fabricate a superconductor tape with at least one or more of variable thickness, high critical current density, and minimal misoriented grain growth. In yet another embodiment, the MOCVD system described herein can fabricate a superconductor tape with a high conversion efficiency of precursor to film.

In yet another embodiment, superconductor tapes made in accordance with the apparatuses described herein comprise variable film thicknesses with at least one of high critical current densities, no grain misorientation, and high precursor to film conversion efficiency.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Figure 1:
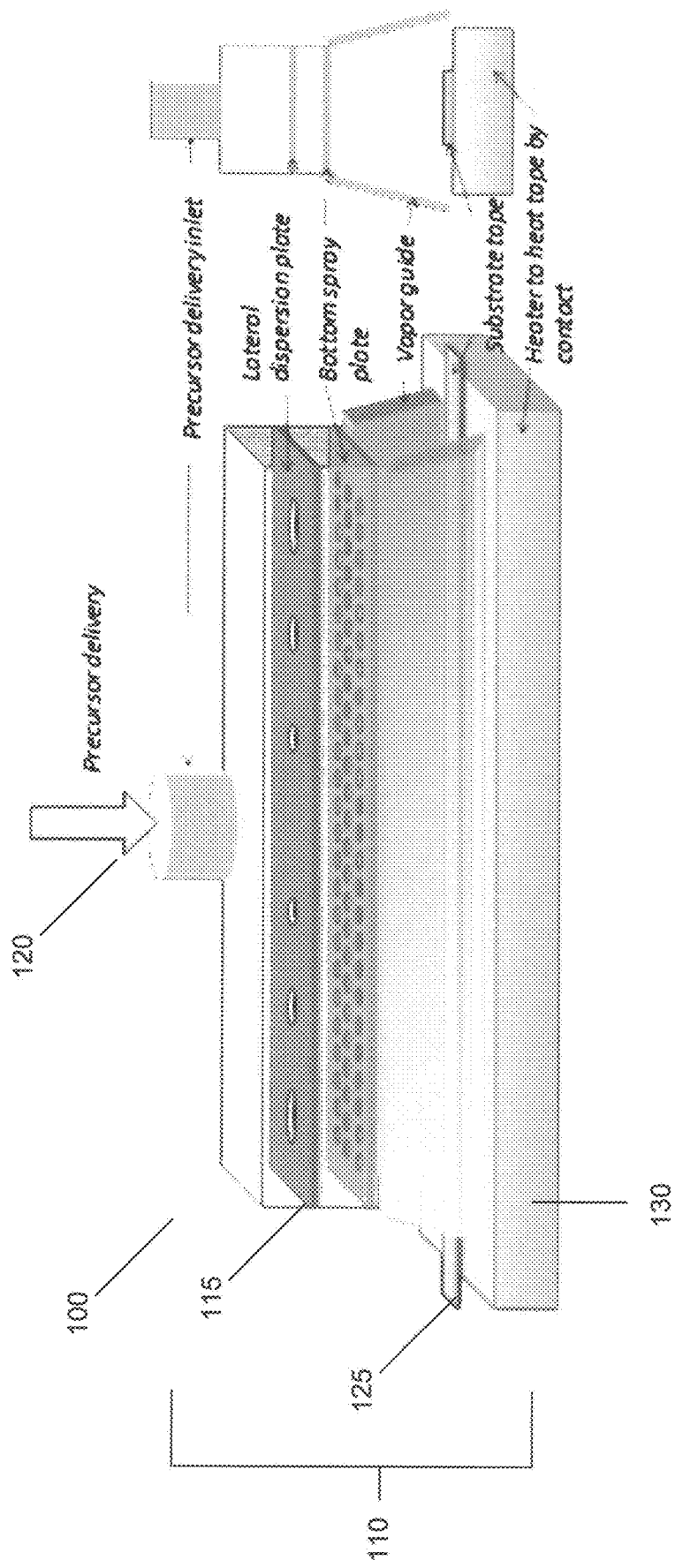
FIG. 1 is a schematic of a showerhead used in prior art MOCVD systems.
Figure 2:
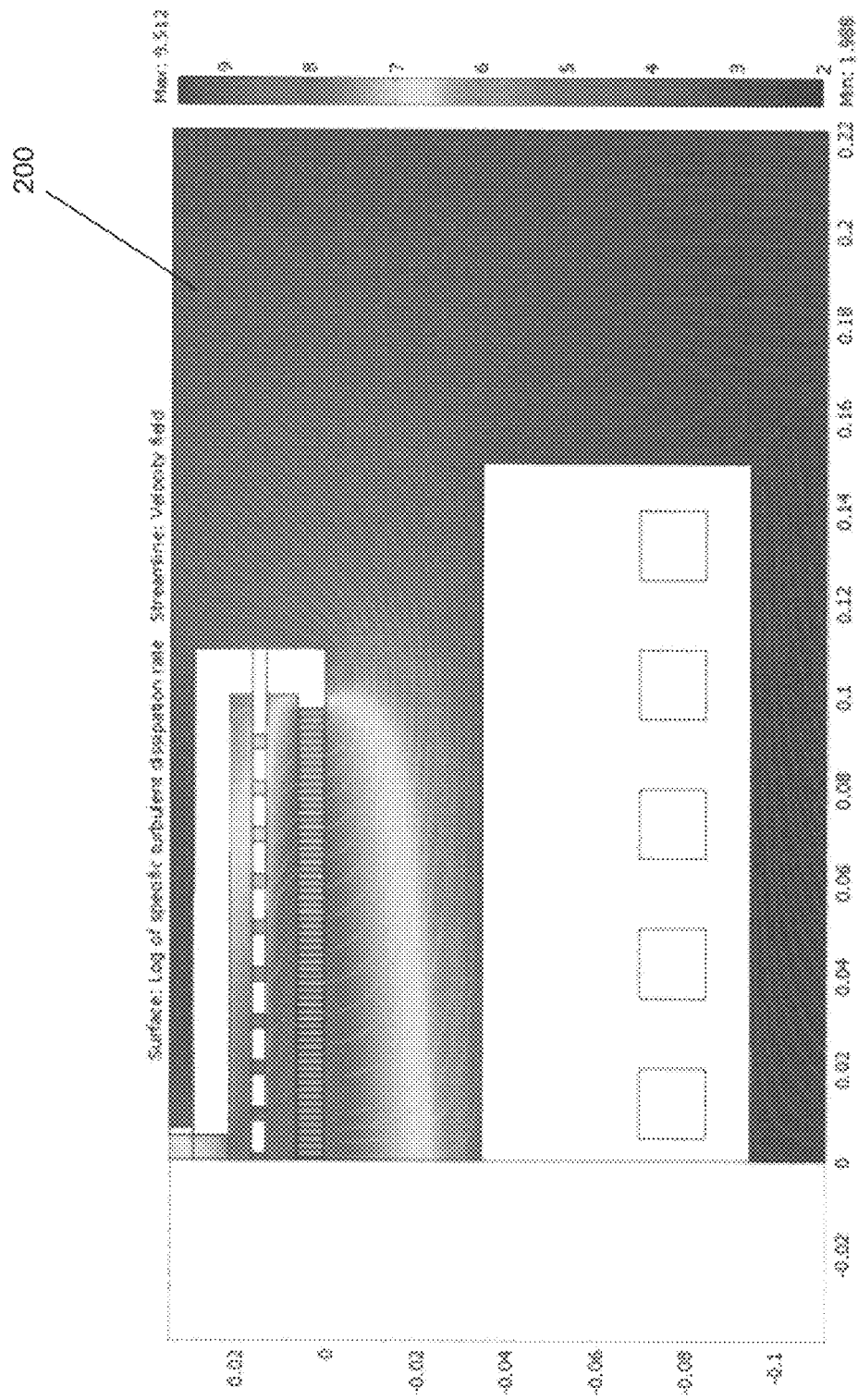
FIG. 2 is a finite element analysis of turbulent fluid flow and solid/fluid heat transfer in prior art MOCVD systems.
Figure 3A:
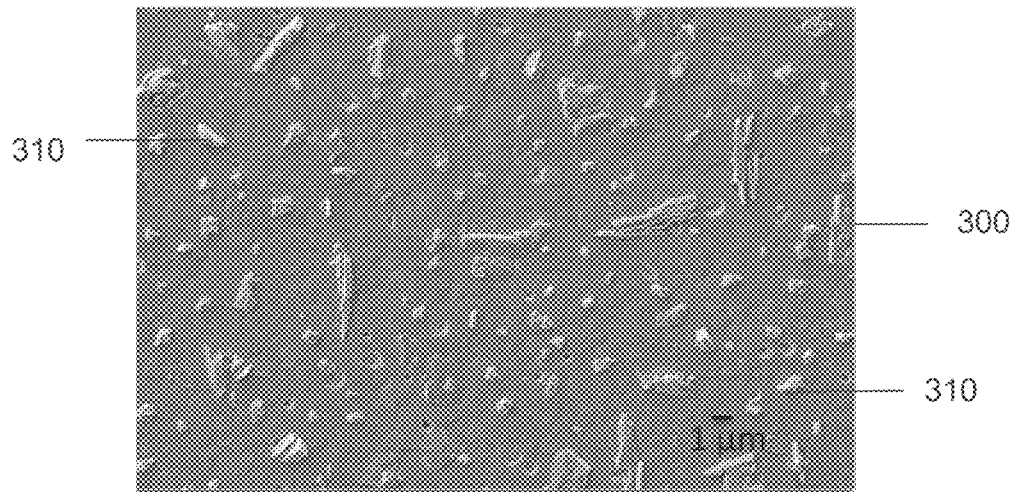
FIGS. 3A-3C illustrate surface microstructures of 1 µm and 2 µm thick superconductor tapes fabricated by prior art MOCVD systems.
Figure 3B:
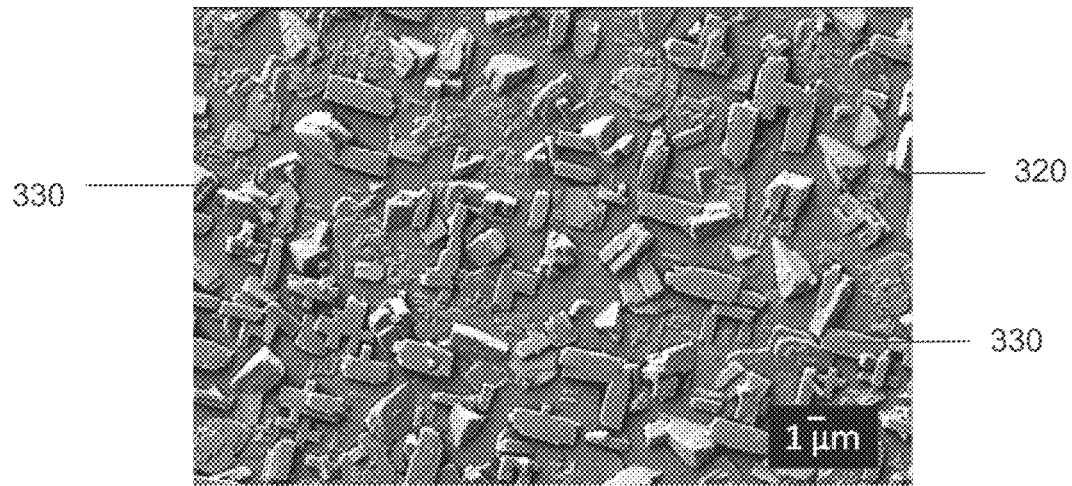
Figure 3C:
Figure 4:
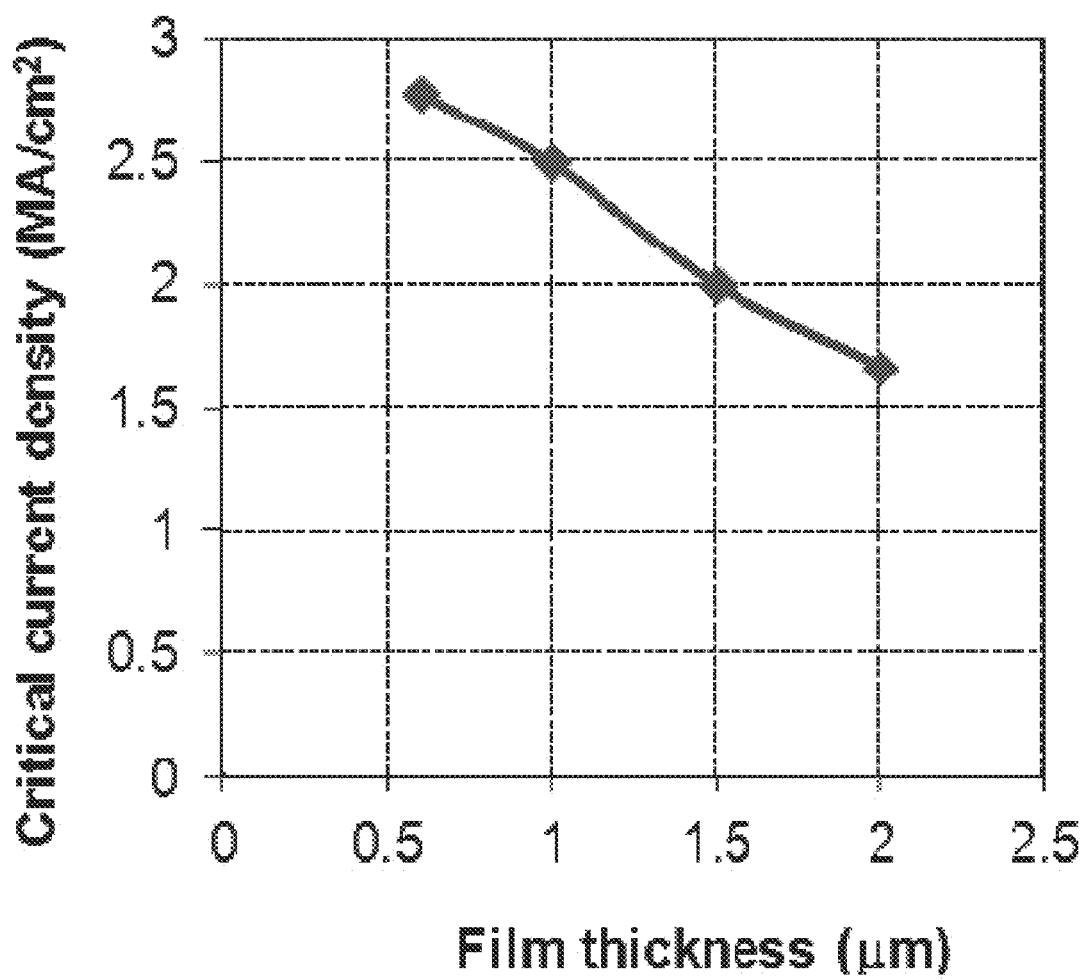
FIG. 4 illustrates critical current density as a function of superconducting tape film thickness in tape fabricated by prior art MOCVD systems.

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented systems, methods, features, and advantages will be or become apparent to one with skill in the art upon examining the drawings and the detailed description herein. It's intended that all such additional systems, methods, features, and advantages be protected by the accompanying claims.

Figure 5A:
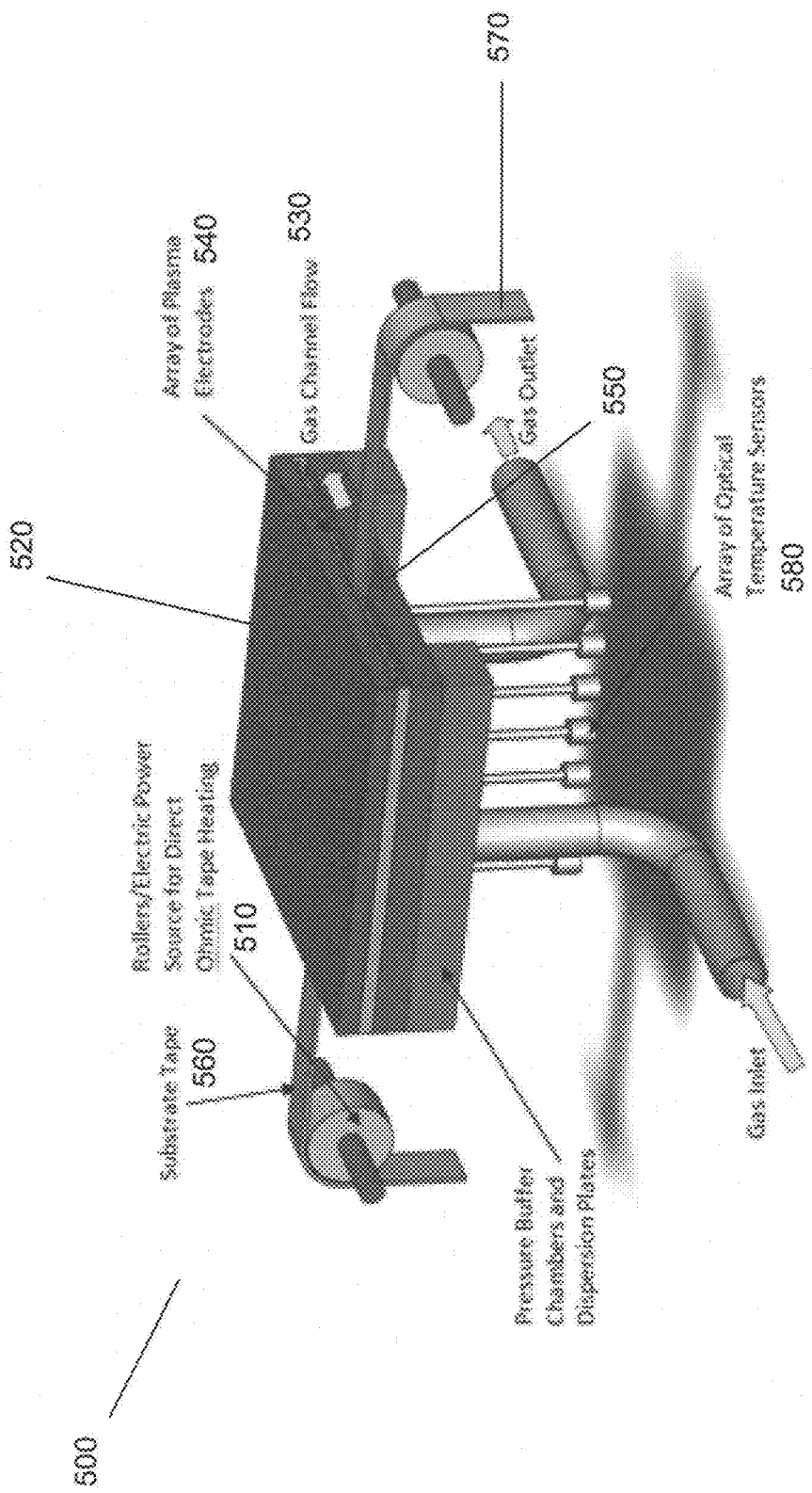
FIGS. 5A-5B illustrate schematics of an improved MOCVD system, in accordance with an embodiment.
Figure 5B:
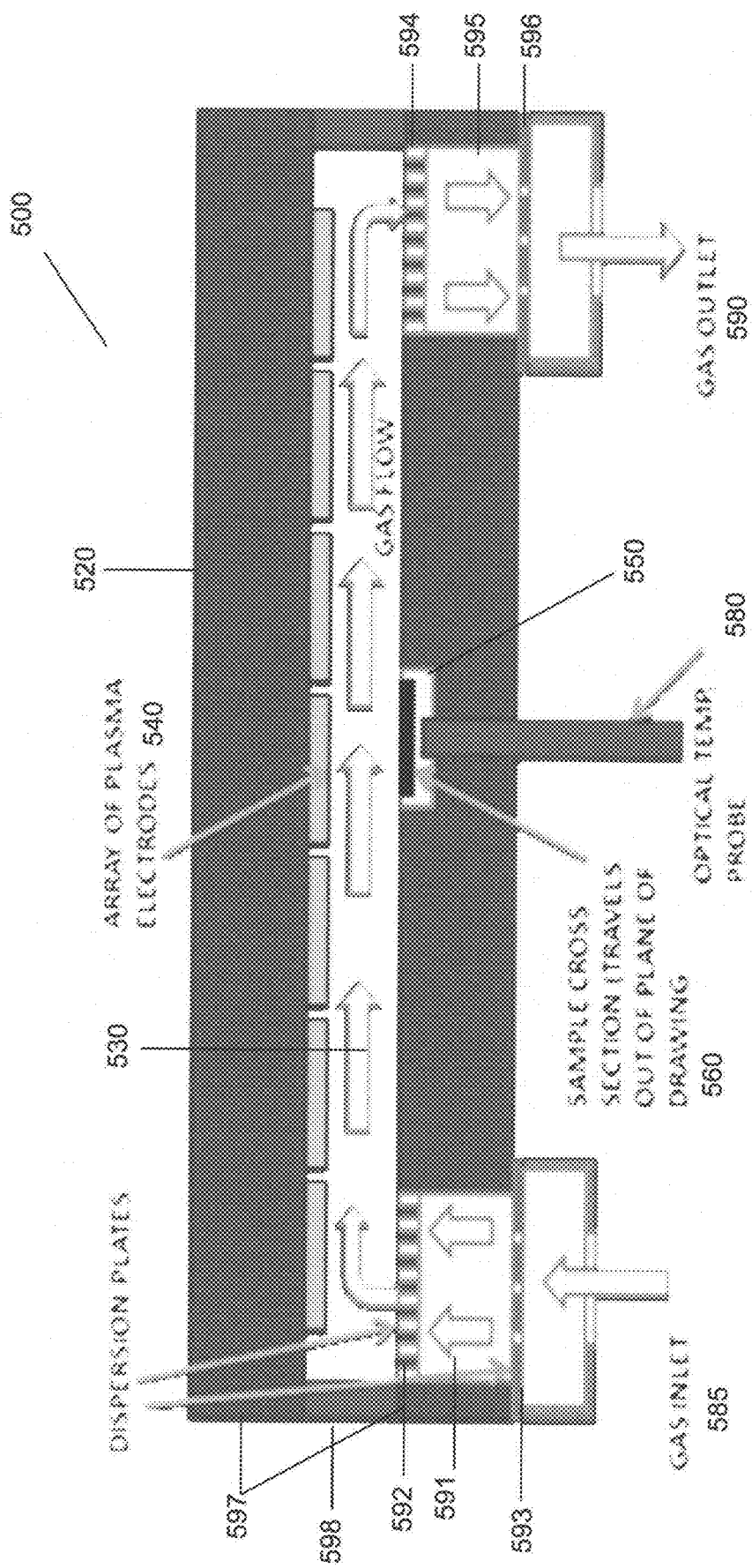

FIGS. 5A and 5B show an embodiment of an improved MOCVD system 500 and a cross-section of the improved MOCVD system 500, respectively. In one embodiment, the system may primarily comprise an Ohmic heating system 510, a housing 520, a flow chamber 530, an array of electrodes 540, and a groove 550. The improved MOCVD 500 can be designed to heat a substrate tape 560 and buffer layer to an optimum temperature followed by a precursor deposition to fabricate a superconducting film 570. The improved MOCVD 500 may be designed to fabricate tape 570 with substantially thick superconducting film with a high current density by applying uniform heating and uniform precursor deposition to a substrate tape 560. In one embodiment, the film thickness is between approximately 1 μm and 10 μm.

In another embodiment, the substrate tape 560 may contact a surface of a roller 510 made of highly-conductive metal such as copper, outside the deposition zone. The metal roller 510 may heat the tape 560 directly though DC electric current flowing through the roller 510, i.e. Ohmic heating. In one embodiment, the tape is heated to approximately 700-800° C. Direct ohmic heating provides a means for obtaining highly uniform temperature distribution across the length of the tape 560. Since the heating is not from an external heat source, the stability of the tape 560 temperature can be maintained over long manufacturing processes. Furthermore, because the tape 560 is suspended and only in contact with the rollers 510 at the tape 560 ends, the result is a substantially small thermal mass compared to a prior art heating block. In addition contact heating and the associated problems that exist in conventional systems (tape in contact with susceptor/heating block) are completely eliminated. Also, since the heating is not by contact with an external heater, sporadic fluctuations in temperature due to loss of contact can be eliminated. Furthermore, in yet another embodiment, the current can be flowed from the rolling heater 510 through a high resistive metallic tape such as Hastelloy or Inconel, which may act as the substrate for the superconductor tape 560 or a carrier for the tape 560.

In an embodiment, the substrate tape 560 may be designed at an optimal resistance for Ohmic heating. For example, the substrate tape 560 may be designed to have a high enough resistance so that a practical current can be applied to heat the tape 560. In addition, the tape 560 may also be designed to have a low enough resistance so that a practical voltage can be applied to heat the tape 560. For example, in one embodiment, the substrate tape 560 can be designed to have a resistance of approximately 1 ohm. A 1 ohm tape may require a power supply of 20V and 20 A, which is readily available.

Figure 6:
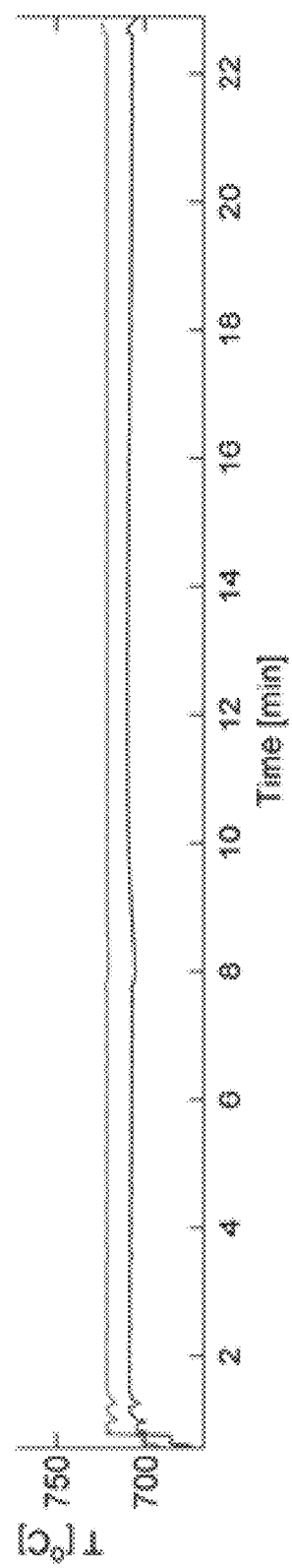
FIG. 6 is a temperature profile of a superconducting tape heated by an improved MOCVD system, in accordance with an embodiment.

In an embodiment, the substrate tape 560 may travel through the MOCVD housing 520 via a groove 550. As the substrate tape 560 travels through the groove 550 it may encounter one or more temperature monitoring devices 580. In one embodiment, the temperature monitoring devices 580 are optical crystal probes 580. In another embodiment, the optical crystal probes 580 are positioned beneath and in close proximity to the traveling substrate tape 560 to monitor the temperature of the back surface of the tape 560. The probes 580 can be positioned outside of the flow chamber 530 so as to not interfere with the gas flow during fabrication. In one embodiment, the temperature signal collected by a probe 580 is fed back to the heating system 510 in a closed PID loop to control the power of the heater system's 510 DC power supply to maintain a constant temperature. Because the thermal mass of the tape 560 is substantially small, fluctuations in temperature can be immediately recognized by the optical probes 580 achieving tight temperature control. In yet another embodiment, the optical crystal probes 580 may be placed in an array. FIG. 6, by way of example only, illustrates a tape temperature profile collected by the optical probes 580 during tape 570 fabrication in an improved MOCVD 500, in accordance with an embodiment. The tape temperature may be maintained within a substantially narrow temperature range during fabrication.

Referring to FIG. 5B, as the substrate tape 560 travels through the groove 550 it may be exposed to a gas flow in a flow chamber 530 positioned in the interior of the housing 520. Gas may enter the housing 520 through a gas inlet 585 and leave the housing through a gas outlet 590. In one embodiment, the gas may include argon and oxygen. In another embodiment, as the gas enters the housing 520 it may pass through an inlet pressure buffer chamber 591, followed by a second inlet dispersion plate 592. In another embodiment, the gas may first pass through an inlet dispersion plate 593 before passing through the inlet pressure buffer chamber 591. In one embodiment, the gas may pass through the inlet pressure buffer chamber 591, which can have a large volume. Then, the gas may pass through the inlet dispersion plate 592 that can include one or more substantially small holes. The inlet dispersion plate 592 may have a small conductance and can uniformly distribute the gas throughout the flow chamber 530. This inlet design can also substantially absorb upstream pressure fluctuations (e.g., fluctuations caused by the precursor delivery system). As a result, pressure fluctuations can be minimized at the substrate tape 560 site so that the tape 560 is fabricated at a substantially constant and optimum temperature.

In another embodiment, as the gas exits the housing 520 it may pass through an outlet dispersion plate 594 followed by an outlet pressure buffer chamber 595. In yet another embodiment, the gas may pass through a second outlet dispersion plate 596 after passing through the outlet pressure buffer chamber 595. In one embodiment, the gas may pass through an outlet dispersion plate 594 that can include one or more substantially small holes. Then, the gas may pass through the outlet pressure buffer chamber 595, which can have a large volume. This outlet design can substantially absorb downstream pressure fluctuations caused by the downstream pump and valves. Again, as a result, pressure fluctuations can be minimized at the substrate tape 560 site so that the tape 560 is fabricated at a substantially constant and optimum temperature.

In one embodiment, the gas may include one or more precursors. The precursors may flow through the chamber 530 to contact the tape 560 for deposition. In another embodiment, the precursor is controlled at a moderate vacuum approximating 2 Torr. In yet another embodiment, the one or more precursors flow through the chamber 530 at a direction parallel to the tape's 560 plane. In still another embodiment, the one or more precursors flow through the chamber 530 at a direction perpendicular to the tape's 560 long axis (cross-flow).

In one embodiment, before the precursor enters the flow chamber 530, it can be vaporized from liquid to vapor when mixed with a hot argon carrier gas. In another embodiment, oxygen gas is injected into the precursor flow to assist the reaction kinetics. In yet another embodiment, once vaporized, the precursor is injected into the improved MOCVD system 500. The flow channel 530 can be maintained at a temperature between approximately 250-300° C. to prevent the precursor from condensing on the channel walls. Because the tape 560 is heated to a substantially higher temperature (e.g., —700-750° C.), the precursor decomposes thermally as it contacts the tape 560 thus depositing the superconductor film.

The aforementioned temperature control design allows for a substantial reduction in the process zone size. For example, the flow of precursor may be directed between two parallel channels 597 that form a substantially small gap 598. The precursor can then flow perpendicular to the tape 560. With such a small gap 598, the flow channel 530 may be highly uniform and laminar with a low volume and low profile. Such flow conditions can eliminate turbulence, temperature losses due to convective heat transfer, and any non-uniformity in flow. Furthermore, the design can maximize conversion efficiency from vapor phase to tape 560 since the flow is confined to a small volume substantially near the tape 560. In one embodiment, the gap 598 between the parallel channels 597 may be modified to a certain size to achieve a desired performance level. For example, the size of the gap 598 may vary from less than 1 mm to approximately ¼ inch.

In an embodiment, the flow chamber 530 further includes an array of one or more parallel-plate capacitive electrodes 540 for plasma activation. It's understood that the dimensions of the electrode 540 (i.e. the size of the plasma) can be flexible and customized to achieve a desired performance level. The electrodes 540 may be positioned in the vicinity of the precursor flow, the vicinity of the tape 560, or both. During fabrication, the electrodes 540 can be connected to a plasma source. Plasma can be introduced in the flow channel 530 to activate the precursors. This plasma activation can improve reaction kinetics and thus further increase the precursor disassociation rate from the vapor phase to the tape 560. This design can substantially improve the precursor to film conversion efficiency. In one embodiment, the plasma can be introduced upstream of the tape 560. In another embodiment, the plasma can be introduced directly over the tape 560.

It's understood that the above description is intended to be illustrative, and not restrictive. The material has been presented to enable any person skilled in the art to make and use the inventive concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLES

Figure 7:
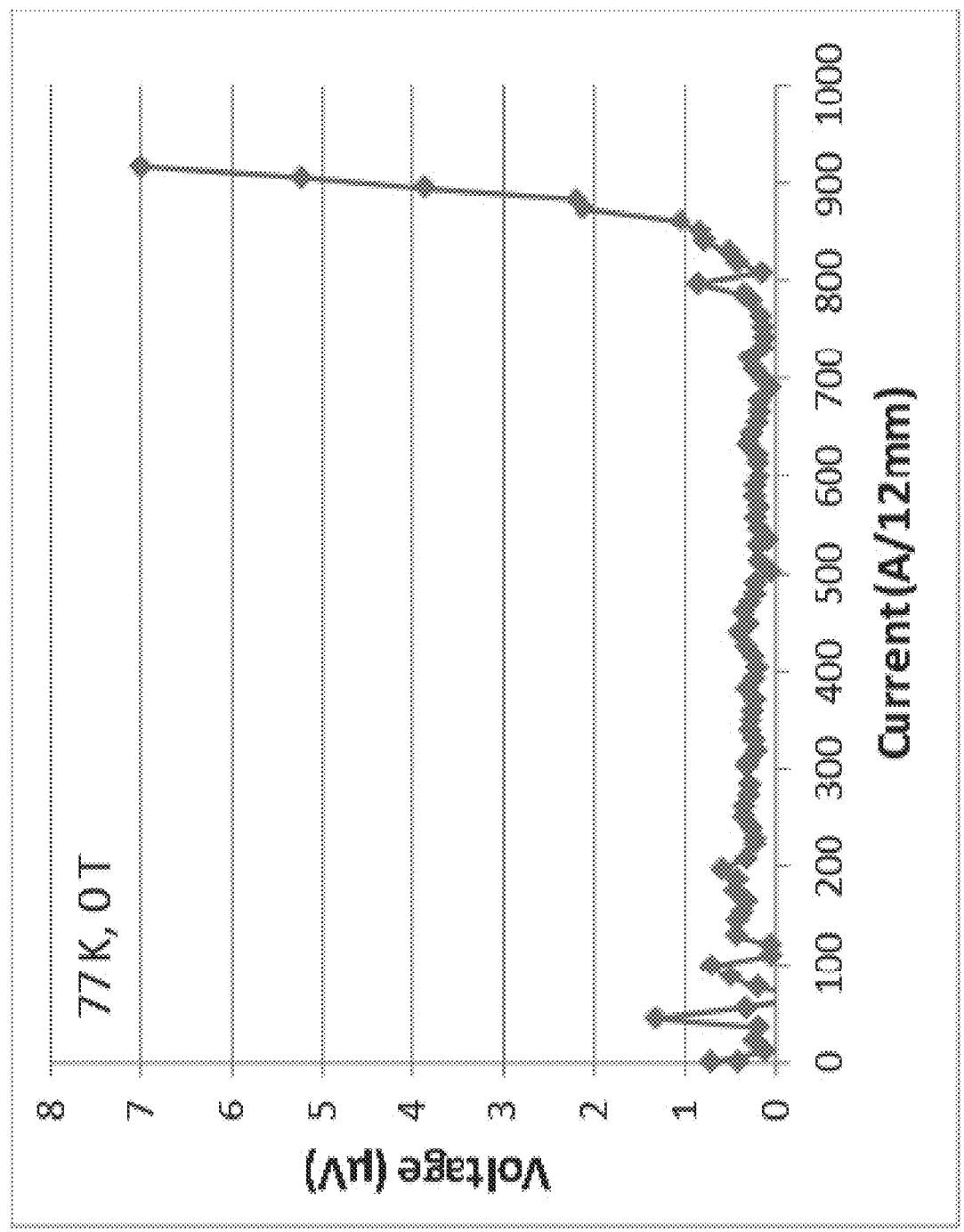
FIG. 7 illustrates critical current density measurements of a 1.8 µm thick $REB_{a2}Cu_3O_7$ superconducting tape made by an improved MOCVD system, in accordance with an embodiment.

Example 1: FIG. 7, by way of example only, displays the current-voltage characteristics (i.e. critical current density) of a 1.8 μm thick $REB_{a2}Cu_3O_7$ film. The film was fabricated in an improved MOCVD system, such as the embodiment described in FIGS. 5A-5B. The data shows that the tape has a critical current at 916 A over a 12 mm width, at 77 K in a zero applied magnetic field, which corresponds to a current density at 4.24 $MA/cm^2$. This is a substantially high current density for an MOCVD-fabricated superconductor tape with thickness greater than 1 μm.

Figure 8:
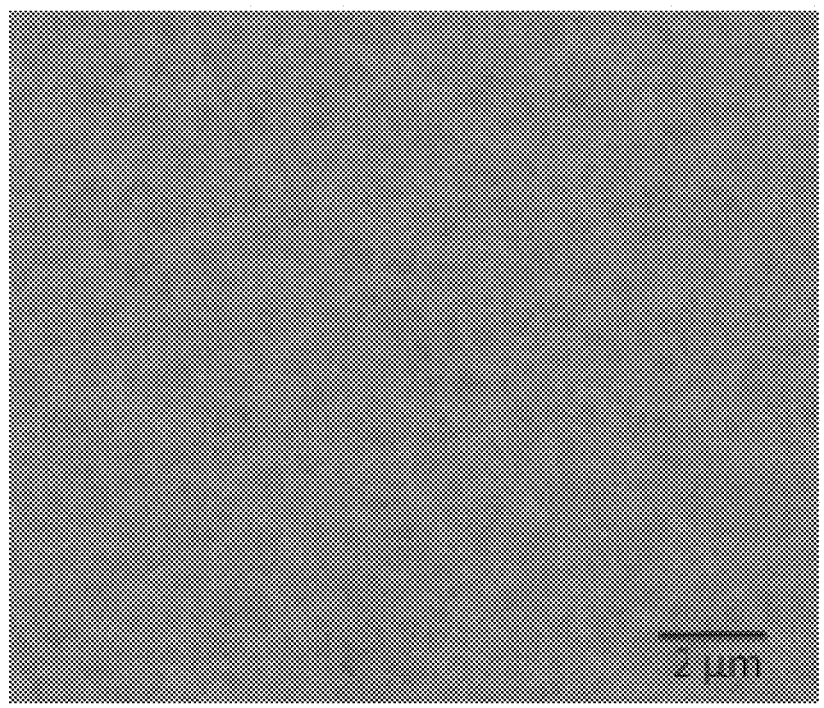
FIG. 8 illustrates a surface microstructure of a 2 µm thick $REB_{a2}Cu_3O_7$ superconducting tape made by an improved MOCVD system, in accordance with an embodiment.

Example 2: FIG. 8 illustrates the surface microstructure of a 2 μm thick $REB_{a2}Cu_3O_7$ film. The film was fabricated in an improved MOCVD system, such as the embodiment described in FIGS. 5A-5B. The tape is substantially uniform with no observable misoriented grain growth.

Figure 9A:
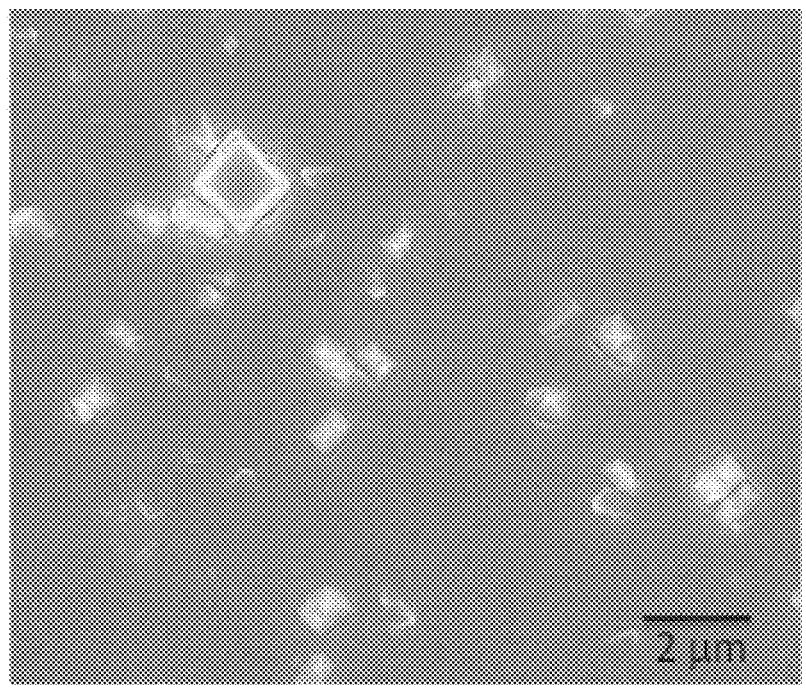
FIGS. 9A-9C illustrate surface, cross sectional microstructures and 2-D X-ray diffraction data from a 3.2 µm thick $REB_{a2}Cu_3O_7$ superconducting tape made by an improved MOCVD system, in accordance with an embodiment.
Figure 9B:
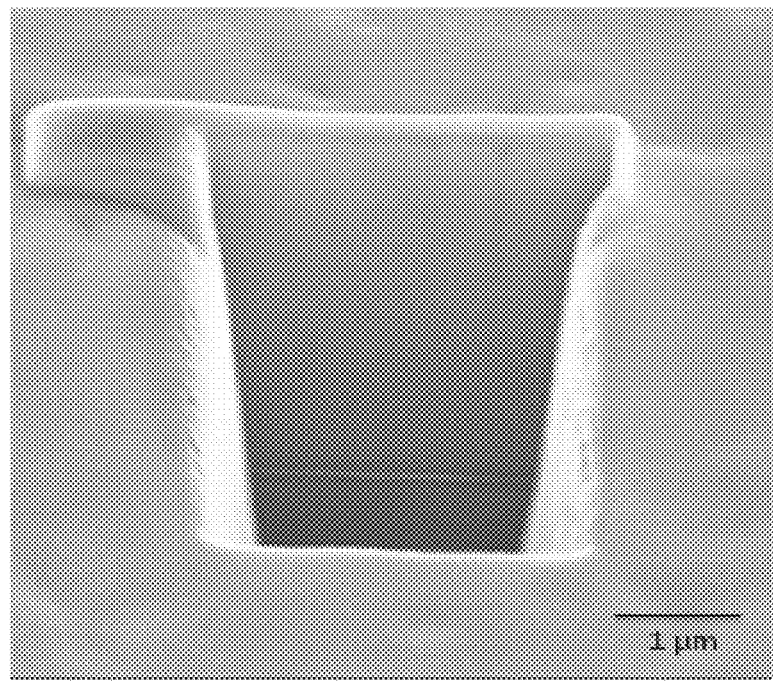
Figure 9C:
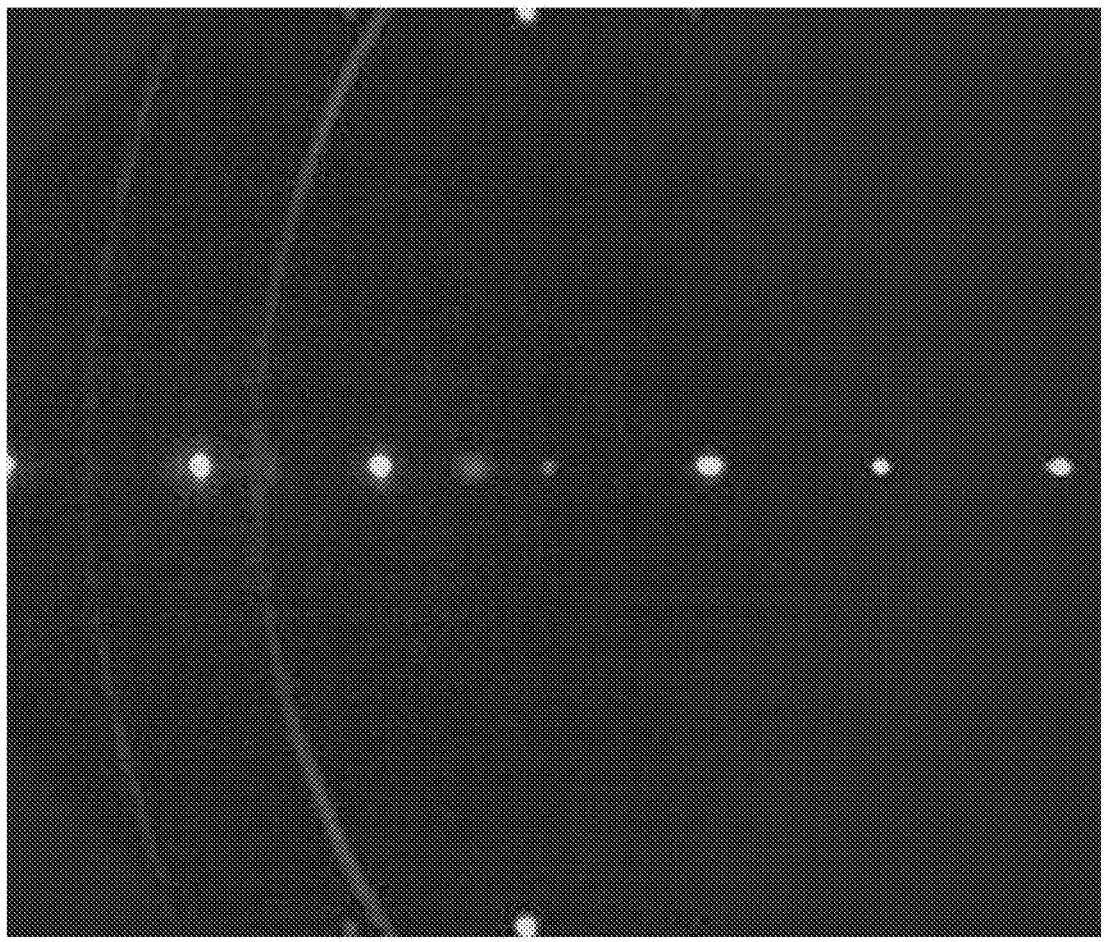

Example 3: FIG. 9A illustrates a surface microstructure of a 3.2 μm thick $REB_{a2}Cu_3O_7$ film. The film was fabricated in an improved MOCVD system, such as the embodiment described in FIGS. 5A-5B. The tape is substantially uniform with no observable misoriented grain growth. There are some secondary phases relegated to the surface. FIG. 9B shows a cross section microstructure of the same 3.2 μm thick $REB_{a2}Cu_3O_7$ film. The cross-section is substantially homogenous and also shows no misoriented grain growth. FIG. 9C shows 2-D X-ray Diffraction data for the 3.2 μm thick $REB_{a2}Cu_3O_7$ film. Again, this data shows that the film lacks misoriented grain growth (i.e. no diffraction spots corresponding to non (001) orientation, perpendicular to the central horizontal axis). The data further reveals the presence of grains only along the c-axis (i.e. diffraction spots along the central horizontal axis).

Figure 10A:
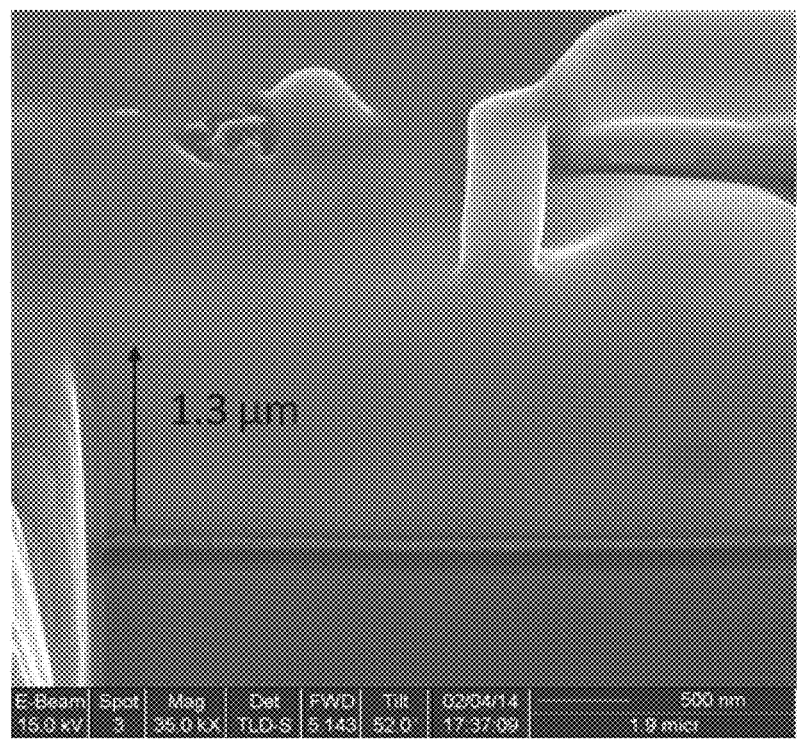
FIGS. 10A-10B illustrate cross sectional microstructures of 1.3 and 4.1 µm thick $REB_{a2}Cu_3O_7$ superconducting tapes made by an improved MOCVD system, in accordance with an embodiment.
Figure 10B:
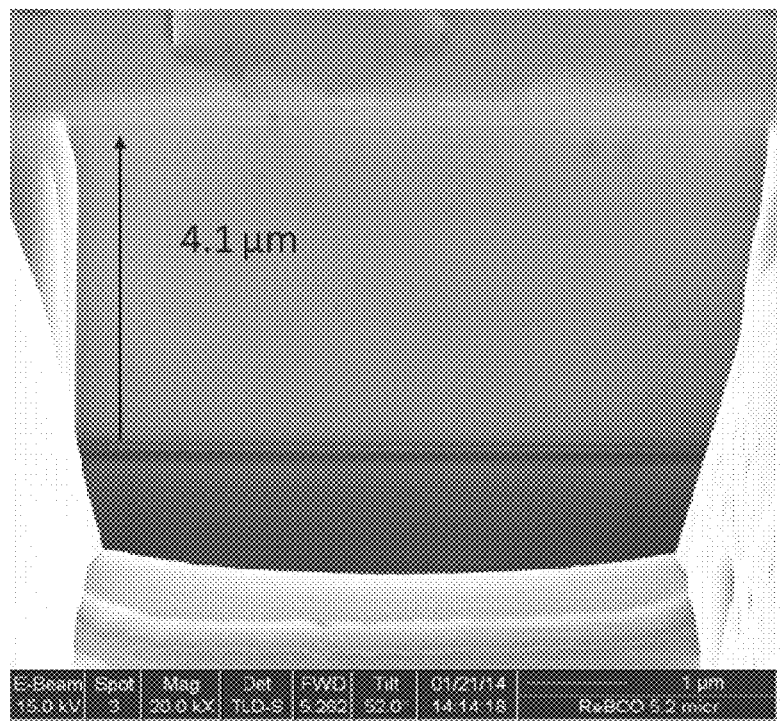

Example 4: FIG. 10A illustrates a Scanning Electron Microscopy (SEM) micrograph of a cross-section of a 1.3 μm thick $REB_{a2}Cu_3O_7$ film (made by Focused Ion Beam milling). The film was fabricated in an improved MOCVD system, such as the embodiment described in FIGS. 5A-5B. The film was fabricated at a channel width of ¼", flow rate of 2.5 mL/min, 0.05M/L precursor molarity, and 2.1 cm/min deposition speed. When these identical conditions are applied in a conventional MOCVD system, the result is a $REB_{a2}Cu_3O_7$ film with 0.85 μm thickness. In other words, the improved MOCVD system herein provides a 153% improved precursor conversion efficiency over conventional systems. Similarly, FIG. 10B illustrates a Scanning Electron Microscopy (SEM) micrograph of a cross-section of a 4.1 μm thick $REB_{a2}Cu_3O_7$ film (made by Focused Ion Beam milling). The film was fabricated in an improved MOCVD system, such as the embodiment described in FIGS. 5A-5B. The film was fabricated at a channel width of ⅛", flow rate of 2.5 mL/min, 0.1M precursor molarity, and 2.1 cm/min deposition speed. When these identical conditions are applied in a conventional MOCVD system, the result is a $REB_{a2}Cu_3O_7$ film with 1.7 μm thickness. In other words, the improved MOCVD system herein provides a 240% improved precursor conversion efficiency over conventional systems.

What is claimed is:

1. A method of fabricating a superconductor tape by metal organic chemical vapor deposition using a precursor to film conversion, the method comprising:
   heating a superconductor substrate tape via ohmic heating; and
   laminarly flowing the precursor in a gas phase such that the precursor thermally decomposes upon contact with the heated superconductor substrate tape thereby forming a superconductor film;
   wherein the precursor to film conversion efficiency is greater than approximately 20% of theoretical value.

2. The method of claim 1, wherein the superconductor tape is a REBCO film.

3. The method of claim 2, wherein the REBCO film comprises the formula $REB_{a2}Cu_3O_7$.

4. The method of claim 1, wherein the superconductor tape is substantially uniform.

5. The method of claim 1, wherein the superconductor tape comprises no observable misoriented grain growth.

6. The method of claim 1, wherein the precursor to film conversion efficiency is a result of a conversion of precursor to film performed within a gap in a range from less than 1 mm to approximately ¼ inch.

7. The method of claim 6, wherein the gap is defined by an upper surface and a lower surface parallel to the upper surface.

8. The method of claim 1, wherein the superconductor tape comprises a film thickness greater than approximately 2 μm and a critical current density greater than approximately 4 MA/cm$^2$ at 77 K in a zero applied magnetic field.

9. The method of claim 8, wherein the superconductor tape further comprises non c-axis grain orientation less than approximately 10%.

10. A method of fabricating a superconductor tape by metal organic chemical vapor deposition, the method comprising:
heating a superconductor substrate tape via ohmic heating; and
laminarly flowing a precursor in a gas phase such that the precursor thermally decomposes upon contact with the heated superconductor substrate tape thereby forming a superconductor film,
wherein the superconductor tape comprises a film thickness greater than approximately 2 μm and a critical current density greater than approximately 4 MA/cm$^2$ at 77 K in a zero applied magnetic field.

11. The method of claim 10, wherein the superconductor tape further comprises non c-axis grain orientation less than approximately 10%.

12. The method of claim 10, wherein the superconductor tape is a REBCO film.

13. The method of claim 12, wherein the REBCO film comprises the formula $REB_{a2}Cu_3O_7$.

14. The method of claim 10, wherein the superconductor tape is substantially uniform.

15. The method of claim 10, wherein the superconductor tape comprises no observable misoriented grain growth.

* * * * *